United States Patent
Kojima et al.

(10) Patent No.: US 7,675,140 B2
(45) Date of Patent: Mar. 9, 2010

(54) SEMICONDUCTOR CIRCUIT DEVICE AND DISPLAY DATA LINE DRIVER

(75) Inventors: Shuichiro Kojima, Fukuoka (JP); Mamoru Seike, Osaka (JP); Takashi Ichihara, Osaka (JP)

(73) Assignee: Panasonic Corporation, Osaka (JP)

( * ) Notice: Subject to any disclaimer, the term of this patent is extended or adjusted under 35 U.S.C. 154(b) by 289 days.

(21) Appl. No.: 11/520,021

(22) Filed: Sep. 13, 2006

(65) Prior Publication Data

US 2007/0063289 A1 Mar. 22, 2007

(30) Foreign Application Priority Data

Sep. 13, 2005 (JP) .............................. 2005-264970

(51) Int. Cl.
*H01L 29/735* (2006.01)

(52) U.S. Cl. ................ 257/544; 257/555; 257/E29.019

(58) Field of Classification Search ................ 257/503, 257/526, 547, 544, 555, E29.019
See application file for complete search history.

(56) References Cited

U.S. PATENT DOCUMENTS

| | | | |
|---|---|---|---|
| 4,646,124 A * | 2/1987 | Zunino | ........................ 257/370 |
| 4,937,647 A | 6/1990 | Sutton | |
| 5,012,317 A | 4/1991 | Rountre | |
| 5,739,717 A | 4/1998 | Nakamura | |
| 5,892,268 A * | 4/1999 | Yashita et al. | ................ 257/544 |
| 6,492,208 B1 | 12/2002 | Cheng et al. | |
| 6,576,934 B2 | 6/2003 | Cheng et al. | |
| 6,593,629 B2 * | 7/2003 | Yamamoto | ................... 257/351 |
| 6,992,647 B2 * | 1/2006 | Hanada et al. | ................. 345/76 |
| 7,067,899 B2 * | 6/2006 | Kanda et al. | ................. 257/556 |
| 7,462,530 B2 * | 12/2008 | Rittaku | ........................ 438/208 |
| 7,485,922 B2 * | 2/2009 | Otake et al. | .................. 257/335 |
| 2005/0145891 A1 | 7/2005 | Abe | |

FOREIGN PATENT DOCUMENTS

| | | |
|---|---|---|
| JP | 59-61169 | 4/1984 |
| JP | 2001-53228 | 2/2001 |

* cited by examiner

*Primary Examiner*—Allan R. Wilson
(74) *Attorney, Agent, or Firm*—McDermott Will & Emery LLP (57) ABSTRACT

An N-type diffusion layer fixed at a potential equal to or above 0V is provided in a segregating region between terminals, and a P-type diffusion layer having a potential equal to that of the N-type diffusion layer on an N-type well constitute a drain of a transistor.

3 Claims, 10 Drawing Sheets

SEMICONDUCTOR CIRCUIT DEVICE AND DISPLAY DATA LINE DRIVER

BACKGROUND OF THE INVENTION

1. Field of the Invention

The present invention relates to a semiconductor circuit device and a display data line driver comprising the semiconductor circuit device, more specifically to a display data line driver used for driving a display panel on which an image is displayed with a high-voltage driving signal such as a plasma display panel.

2. Description of the Related Art

In recent years, a plasma display panel (hereinafter, referred to as PDP) which has been attracting attention as a thin and high-definition display device comprises a plurality of discharge cells consisting of data electrodes and scan/sustain electrodes arranged in a matrix shape. In the discharge cells, discharge are controlled by data electrode wirings and san electrode wirings and sustain electrode wirings that is orthogonal to the data electrode wirings, and a desired display image is obtained through the discharges emission or non-light emission.

In order to drive the PDP thus constituted, a semiconductor circuit device including a level shifter for converting a digital RGB color image signal into a high voltage capable of driving the PDP is used.

In the circuit for driving the PDP comprising the semiconductor circuit device, an NPN parasitic bipolar transistor is formed. However, a current characteristic of the NPN parasitic bipolar transistor is determined by physical constitution, diffusion concentration, voltage between collector and emitter. Therefore, as a drive power-supply voltage (VCC) is higher and a collector current is larger, thermal destruction is more easily generated because a high electric field is applied to a collector junction.

In order to deal with the disadvantage, a destruction resistance can be improved in such a manner that a sufficient distance is secured between adjacent transistors or a SOI (Silicon Oxide Insulated) in which the transistors are insulated with a silicon oxide film is provided as recited in No. 2001-53228 of the Japanese Patent Applications Laid-Open.

In the conventional drive circuit thus improved, however, costs are increased by such factors as mentioned below.

chip size is increased in order to secure the distance between the adjacent transistors.
  A specially arranged process is necessary to make a structure without the formation of the parasitic transistor.

SUMMARY OF THE INVENTION

Therefore, a main object of the present invention is to provide a display data line driver capable of improving a resistance against noises between adjacent terminals while controlling a chip size using a conventional CMOS process.

In order to achieve the foregoing object, a semiconductor circuit device according to the present invention comprises:
  a P-type well;
  a plurality of transistors provided on the P-type well;
  an N-type diffusion layer provided in a transistor segregating region of the P-type well;
  a fixed potential supply terminal for supplying a fixed potential equal to or above a potential of the P-type well to the N-type diffusion layer; and
  a P-type diffusion layer having a potential equal to that of the N-type diffusion layer and constituting drains of the transistors, wherein
    a collector current of a parasitic NPN bipolar transistor formed between the adjacent transistors is controlled. As a result, the circuit can have an improved resistance against destruction of the transistors.

Further, a semiconductor circuit device according to the present invention comprises:
  a P-type well;
  a plurality of transistors provided on the P-type well;
  an N-type well provided in a segregating region between the adjacent transistors;
  an N-type diffusion layer provided on the N-type well; and
  a fixed potential supply terminal for supplying a fixed potential equal to or above a potential of the P-type well to the N-type diffusion layer, wherein
    a collector current of a parasitic NPN bipolar transistor formed between the adjacent transistors is controlled. As a result, the circuit can have an improved resistance against the destruction of the transistors.

As described above, the resistance against the noises between the adjacent terminals can be improved while the chip size is controlled by means of the conventional CMOS process.

Thus, as the collector current of the parasitic NPN transistor can be reduced in the present invention, the resistance against the noises between the adjacent terminals can be improved while the chip size is controlled without any change to the conventional CMOS process.

Further, the N-type well is provided under the N-type diffusion layer in the segregating region between the adjacent transistors so that the collector current of the parasitic NPN transistor can be reduced. Therefore, the resistance against the noises between the adjacent terminals can be improved while the chip size is controlled without any change to the conventional CMOS process.

The semiconductor circuit device according to the present invention is useful for a drive circuit comprising a plurality of output buffers and a display data line driver comprising the drive circuit, more particularly to a drive circuit used for driving a display panel on which an image is displayed with a high-voltage drive signal such as a plasma display panel and a display data line driver and the like.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art by implementing the present invention.

DETAILED DESCRIPTION OF THE INVENTION

Figure 7:
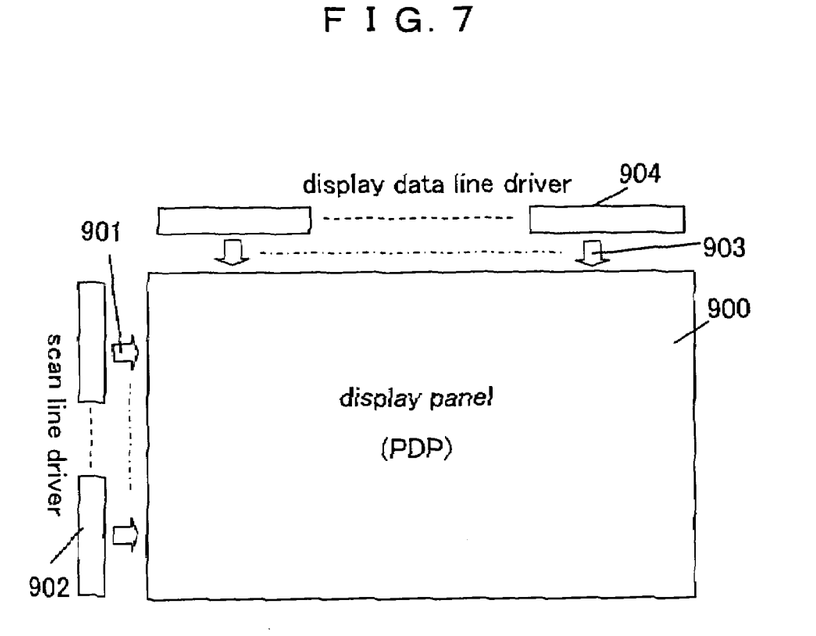
FIG. 7 shows a schematic structure of a conventional plasma display panel.
Figure 8:
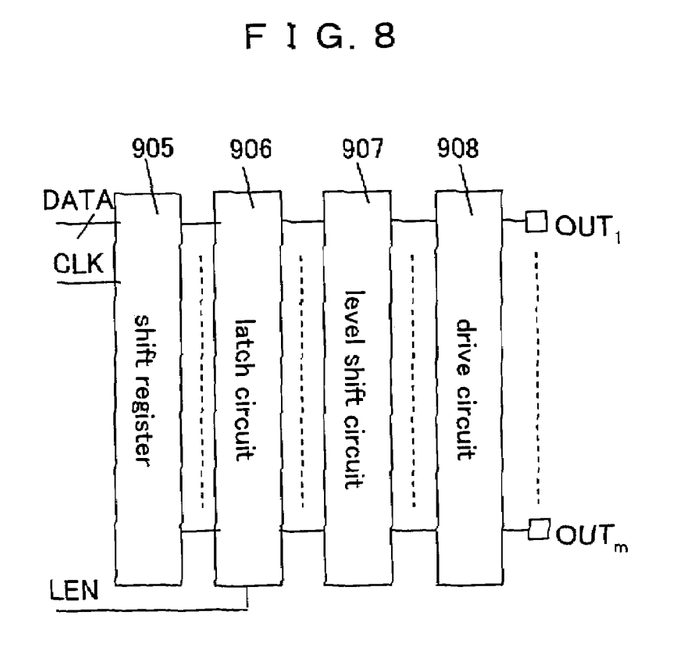
FIG. 8 is a block diagram of a data line driver for driving a conventional PDP.
Figure 9:
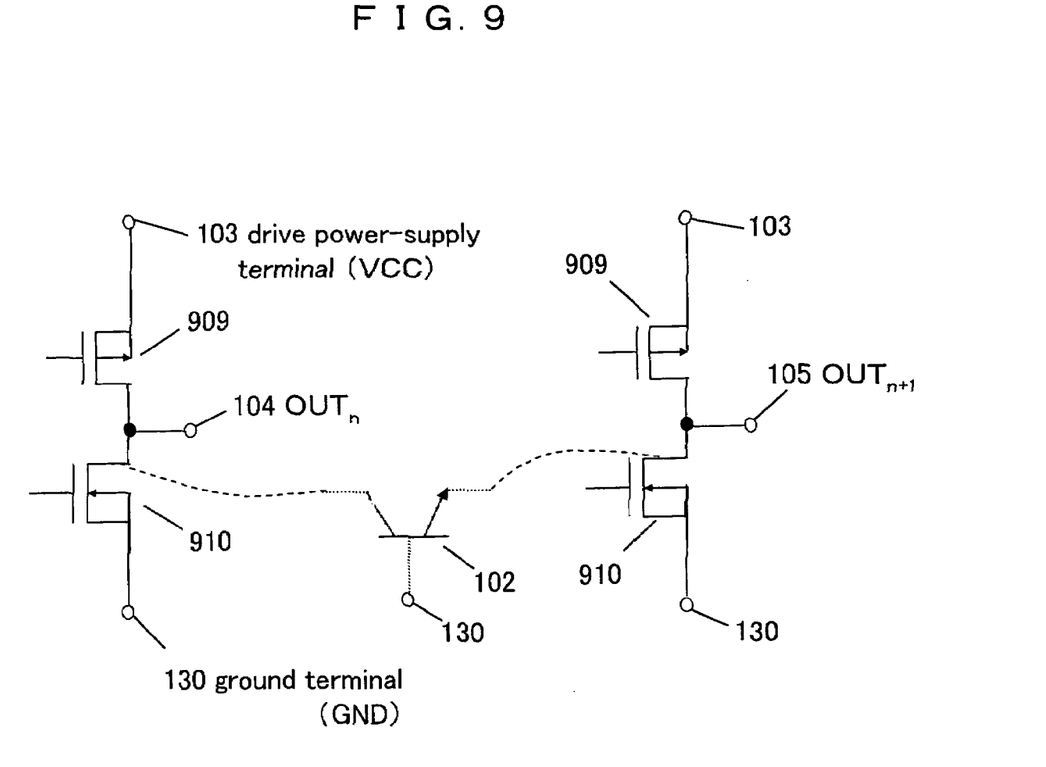
FIG. 9 shows a configuration of a conventional drive circuit.
Figure 10:
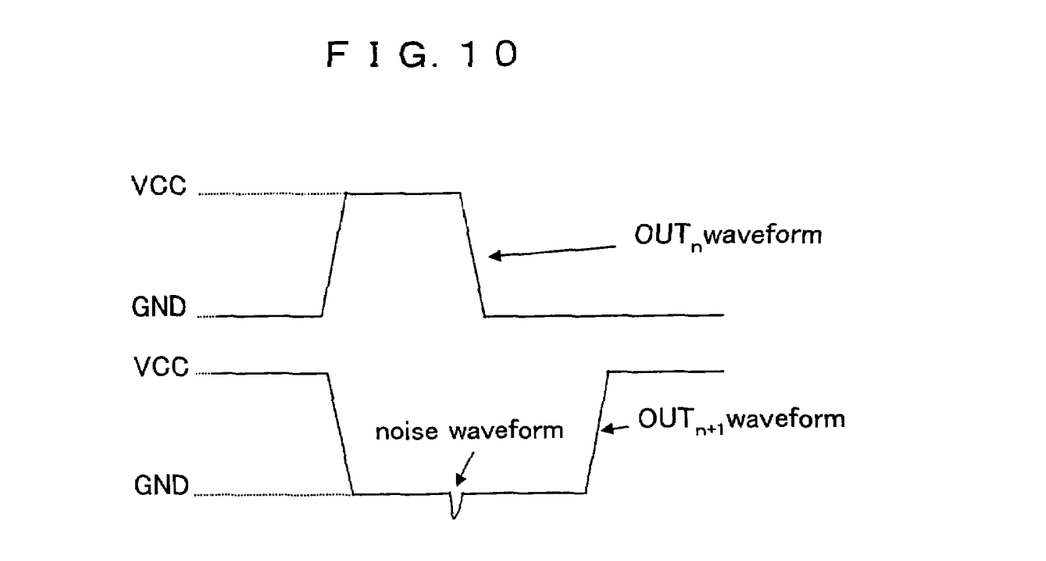
FIG. 10 shows drive waveforms of the conventional drive circuit.
Figure 11:
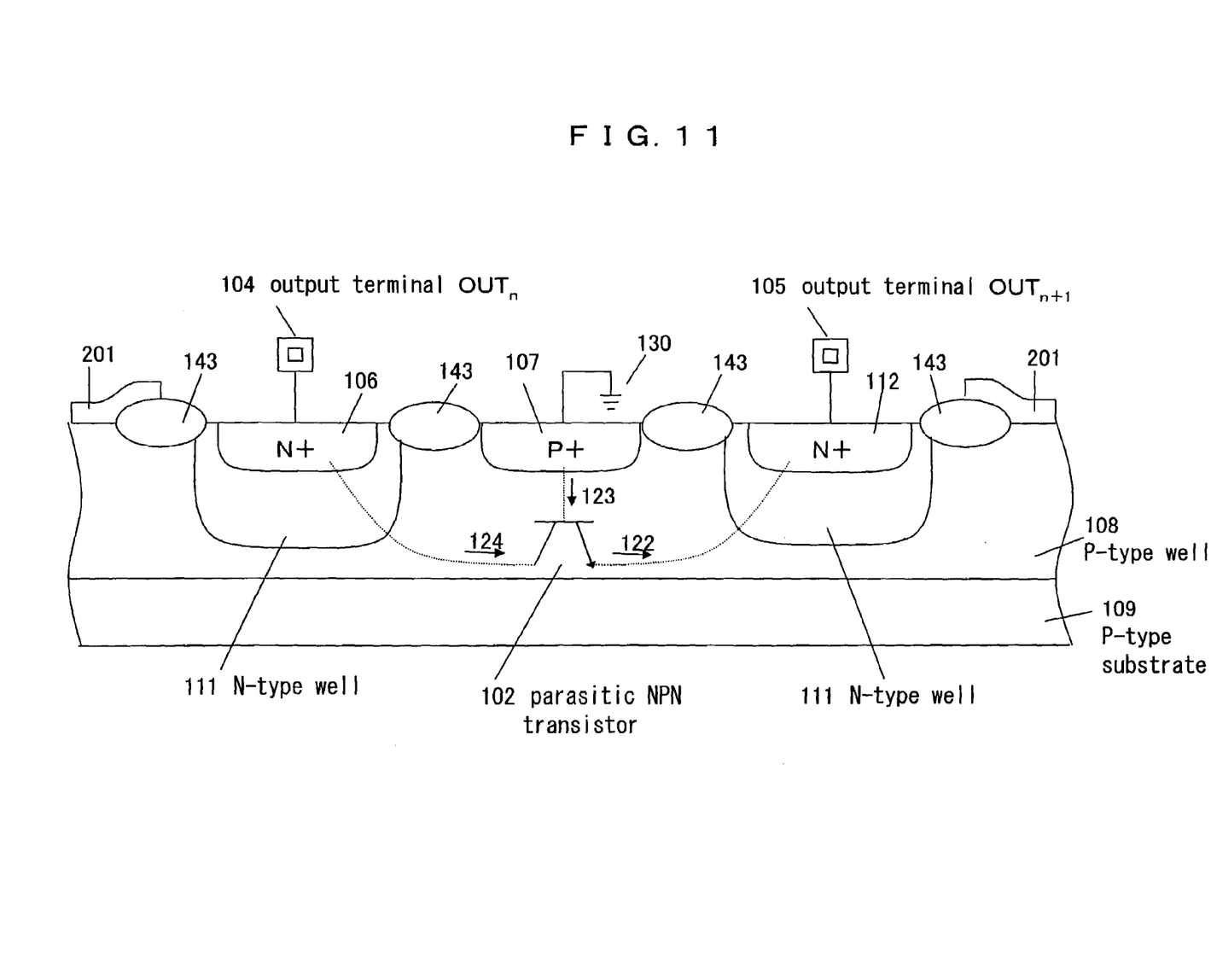
FIG. 11 is a schematic view of a sectional structure of a drive circuit for driving the conventional PDP.
Figure 12:
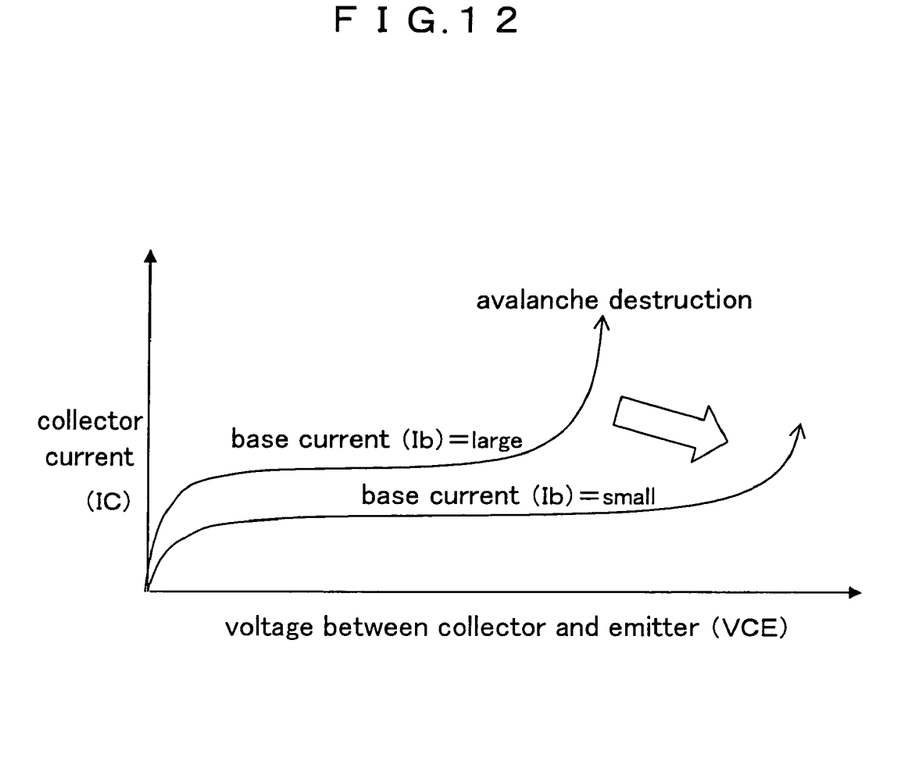
FIG. 12 shows a current characteristic of an NPN parasitic bipolar transistor.

First, a basic structure of a semiconductor circuit device to be improved according to the present invention is described. FIG. 7 shows a schematic structure of a plasma display panel in which the semiconductor circuit device according to the present invention is optimally installed as a display data line driver. FIG. 8 is a block diagram of a display data line driver in which the semiconductor circuit device according to the present invention optimally functions. FIG. 9 shows a configuration of a conventional drive circuit. FIG. 10 shows drive waveforms of the conventional drive circuit. FIG. 11 is a schematic view of a sectional structure of the conventional drive circuit. FIG. 12 shows a current characteristic of an NPN parasitic bipolar transistor in the conventional drive circuit.

As shown in FIG. 7, a PDP 900 is driven by a plurality of scan line drivers 902 connected to a plurality of scan electrode lines 901 and a plurality of display data line drivers 904 connected to a plurality of display data electrode lines 903. In the PDP which performs color display, each of display data electrode lines have three-color electrodes in which fluorescent materials having such different colors as R (Red) G (Green) and B (Blue) are used, and the respective display data electrode lines are separately driven so that the color display is performed.

As shown in FIG. 8, in the display data line drivers, image data inputted from data input terminals is serially supplied to a shift register 905. The serial data received by the shift register 905 is converted into parallel data by the shift register 905, and then retained in a latch circuit 906. The parallel data retained in the latch circuit 906 is voltage-converted by a level shift circuit 907, and then selectively outputted as a ground potential (GND) or a power-supply potential (VCC) from drive output terminals $OUT_{1-m}$ via a drive circuit 908 and applied to the display data electrode lines 903.

FIG. 9 shows a part of a configuration of the drive circuit 908. The drive circuit 908 is constituted as a multiple-output driver (display data line driver) in which a plurality of push-pull circuits are adjacently arranged. Here, an output terminal $OUT_n$ 104 and an output terminal $OUT_{n+1}$ 105 are adjacent to each other, and the output terminal $OUT_n$ 104 and the output terminal $OUT_{n+1}$ 105 have a drive power-supply terminal 103 and a ground terminal 130 in common. In the structure in which the plurality of output terminals OUT are adjacently provided, a self noise resulting from an output change of the output terminal $OUT_{n+1}$ adjacent to the output terminal $OUT_n$ or an external noise generated from the panel is superposed as shown in FIG. 10.

As shown in FIG. 11, a high concentration N-type diffusion layer 106 and a high concentration N-type diffusion layer 112 adjacent thereto in the transistors constituting output buffers are formed on a P-type well 108 fixed to the ground potential (GND). Thereby, an NPN parasitic bipolar transistor 102 is formed between the arbitrary output terminal $OUT_n$ 104 and the output terminal $OUT_{n+1}$ 105 adjacent thereto in such a route as high concentration N-type diffusion layer 106 (linked to the output terminal $OUT_n$ 104)—N-type well 111—P-type well 108—N-type diffusion layer 112 (linked to the output terminal $OUT_{n+1}$ 105).

When a potential difference equal to or above a built-in voltage is generated between the N-type diffusion layer 112 and the P-type well 108 due to the self noise or the external noise in a state where the output terminal $OUT_n$ 104 outputs the "power-supply potential (VCC)" and concurrently the output terminal $OUT_{n+1}$ 105 outputs the "ground potential (GND)", an operation of the NPN parasitic bipolar transistor 102 starts.

Accordingly, the N-type diffusion layer 112 linked to the output terminal $OUT_{n+1}$ 105 serves as an emitter. Then, an emitter current Ie flows from the P-type well 108 to the output terminal $OUT_{n+1}$ 105, and a base current Ib flows from the ground terminal 130 to the P-type well 108. Therefore, the N-type diffusion layer 106 linked to the output terminal $OUT_n$ 104 serves as a collector and the P-type well 108 serves as a base, and a collector current Ic begins to flow from the output terminal $OUT_n$ 104 to the P-type well 108. When the collector current Ic flowing into the collector biased at a high potential exceeds a permissible current value, the collector (N-type diffusion layer 106) is thermally destroyed, which causes a malfunction.

As shown in FIG. 12, a current characteristic of the NPN parasitic bipolar transistor is determined by physical constitution, diffusion concentration, voltage between the collector and emitter. Therefore, as the drive power-supply voltage (VCC) is higher and the collector current is larger, the thermal destruction is more easily caused because a high electric field is applied to a collector junction.

Hereinafter, preferred embodiments of the present invention are described in detail referring to the drawings.

PREFERRED EMBODIMENT 1

Figure 1:
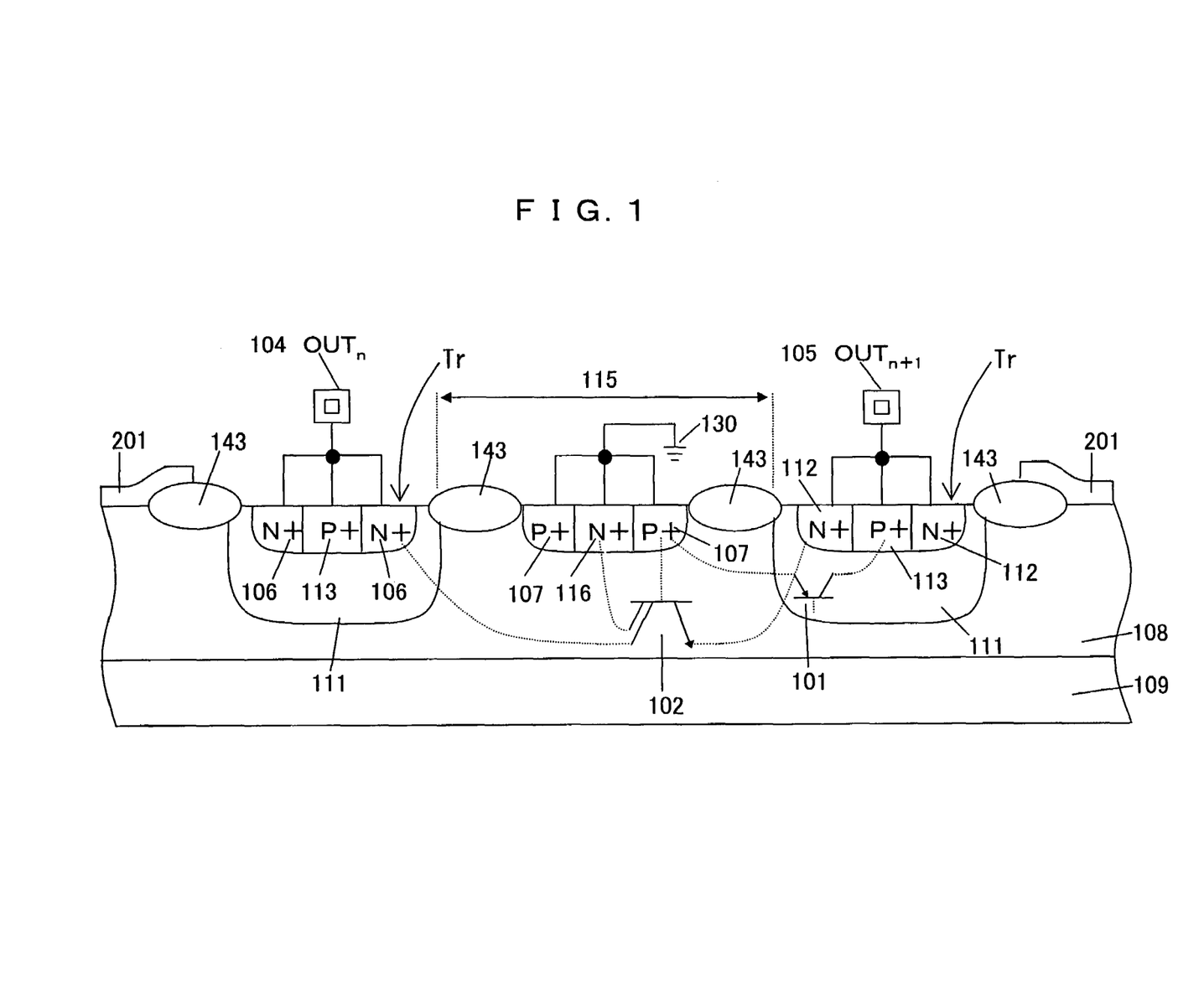
FIG. 1 is a schematic view of a sectional structure of a drive circuit for driving a PDP according to a preferred embodiment 1 of the present invention.
Figure 2:
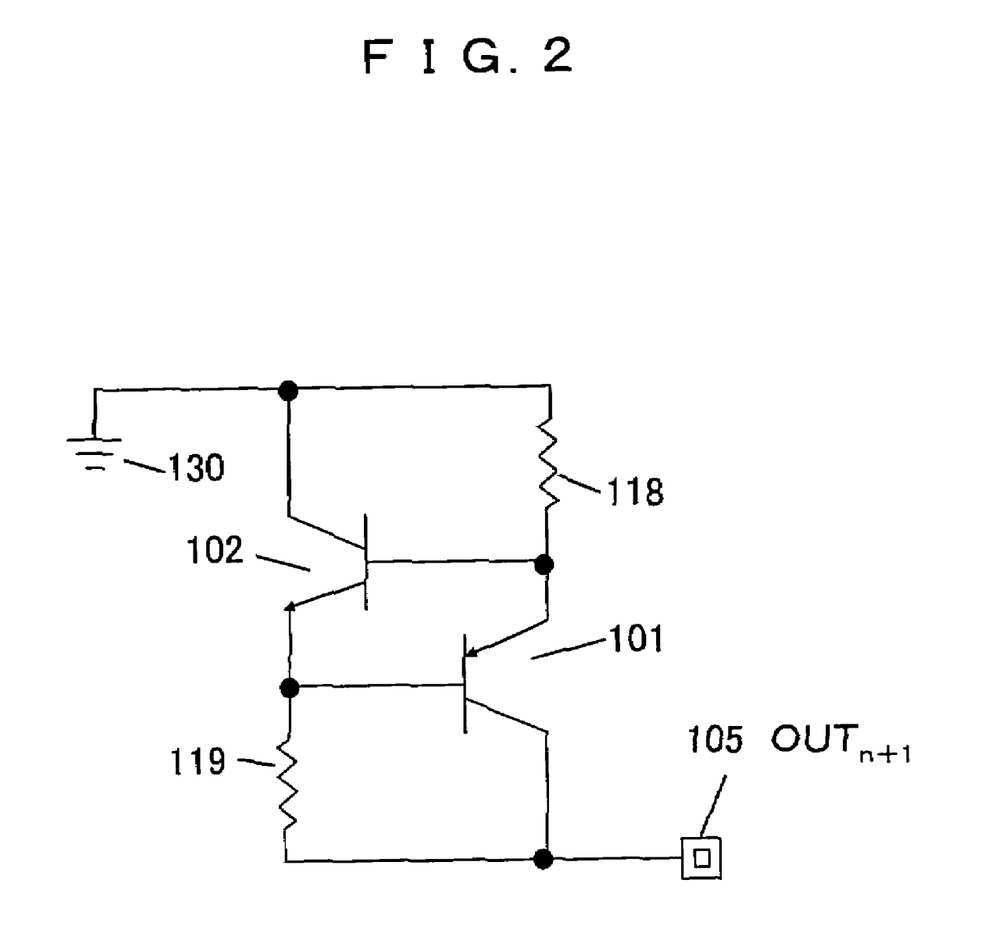
FIG. 2 shows an equivalent circuit between an output terminal $OUT_{n+1}$ and a ground terminal of the drive circuit according to the preferred embodiment 1.

A semiconductor circuit device according to a preferred embodiment 1 of the present invention is described referring to FIGS. 1 and 2. FIG. 1 is a schematic view of a sectional structure of a semiconductor circuit device optimally functioning as a drive circuit (display data line driver) for driving a PDP according to a preferred embodiment 1 of the present invention. FIG. 2 shows a diagram for an equivalent circuit of the semiconductor circuit device according to the preferred embodiment 1.

First, a constitution of the semiconductor circuit device according to the preferred embodiment 1 is described. In FIG. 1, 109 denotes a P-type substrate, 108 denotes a P-type well provided on the P-type substrate 109, Tr denotes a transistor provided on the P-type well 108, 115 denotes a segregating region provided between the transistors Tr and Tr, 107 denotes a high concentration P-type diffusion layer provided in the segregating region 115, 116 denotes a high concentration N-type diffusion layer for reducing a collector current provided in the P-type diffusion layer 107 of the segregating region 115, and 130 denotes a ground terminal (fixed potential supply terminal) connected to the P-type diffusion layer 107 and the N-type diffusion layer 116. A potential of the N-type diffusion layer 116 is fixed at a ground potential (GND) by the ground terminal 130. 111 denotes an N-type well which forms a high withstand voltage drain region of each of the transistors Tr. 106 and 112 denote a high concentration N-type diffusion layer provided in the N-type well 111. 113 denotes a high concentration P-type diffusion layer formed in the high withstand voltage drain region (more specifically, the N-type well 111) of the transistor Tr and constituting a drain of the transistors Tr. The P-type diffusion layer 113 is set to a potential equal to that of the N-type diffusion layer 112. 104 denotes an output terminal $OUT_n$ of the transistor Tr. The output terminal $OUT_n$ 104 is connected to the P-type diffusion layer 113 and the N-type diffusion layer 106. 105 denotes an output terminal $OUT_{n+1}$ of the transistor Tr adjacent to the transistor Tr. The output terminal $OUT_{n+1}$ 105 is connected to the P-type diffusion layer 113 and the N-type diffusion layer 112. 143 denotes LOCOS. 201 denotes a gate formation region.

Next, an operation of the semiconductor circuit device is described. As described earlier, the NPN parasitic bipolar transistor 102 formed between the adjacent terminals is operated due to the self-noise or the external noise so as to generate the flow of the abnormal current, and thereby it becomes a cause of the malfunction or the destruction.

A route of the current flowing when the NPN parasitic bipolar transistor 102 is operated is output terminal $OUT_n$104 →high concentration N-type diffusion layer 106→N-type well 111→P-type well 108→N-type well 111→high concentration N-type diffusion layer 112→output terminal $OUT_{n+1}$ 105 in sequence. Meanwhile, by providing the high concentration N-type diffusion layer 116 for reducing the collector current in the segregating region 115, are two routes, which are high concentration N-type diffusion layer 106→P-type well 108, and high concentration N-type diffusion layer 116→P-type well 108, is formed as the flow, of the collector current of the NPN parasitic bipolar transistor 102. Further, a PNP parasitic bipolar transistor 101 is formed by the P-type diffusion layer 113 formed in the drain regions (N-type well 111) of the transistors Tr. At the time, a thyristor structure shown in the equivalent circuit diagram of FIG. 2 is formed, and the operation of the NPN parasitic bipolar transistor 102 in which the N-type diffusion layer 116 serves as the collector is accelerated. Therefore, the collector current flowing between the output terminal $OUT_n$ 104→high concentration. N-type diffusion layer 106→N-type well 111→P-type well 108 is reduced, and the resistance against the noises between the adjacent terminals in the drive circuit is improved.

As described above, according to the preferred embodiment 1, the N-type diffusion layer 116 for reducing the collector current is provided in the segregating region 115 between the transistors Tr and Tr constituting the drive circuit so that the route of the collector current of the NPN parasitic bipolar transistor 102 is formed. Further, the P-type diffusion layer 113 is provided in the drain regions (N-type well 111) of the transistors Tr so that the PNP parasitic bipolar transistor 101 is formed. The foregoing improvements accelerate the operation of the NPN parasitic bipolar transistor 102 in which the high concentration N-type diffusion layer 116 of the segregating region 115 serves as the collector. Thereby, the collector current flowing between the high concentration N-type diffusion layer 106→N-type well 111→P-type well 108 can be controlled. As a result, the resistance property against the malfunction or the destruction can be improved. Thus, according to the preferred embodiment 1, the resistance against the noises between the adjacent terminals can be improved without any change to the conventional CMOS process.

Figure 3:
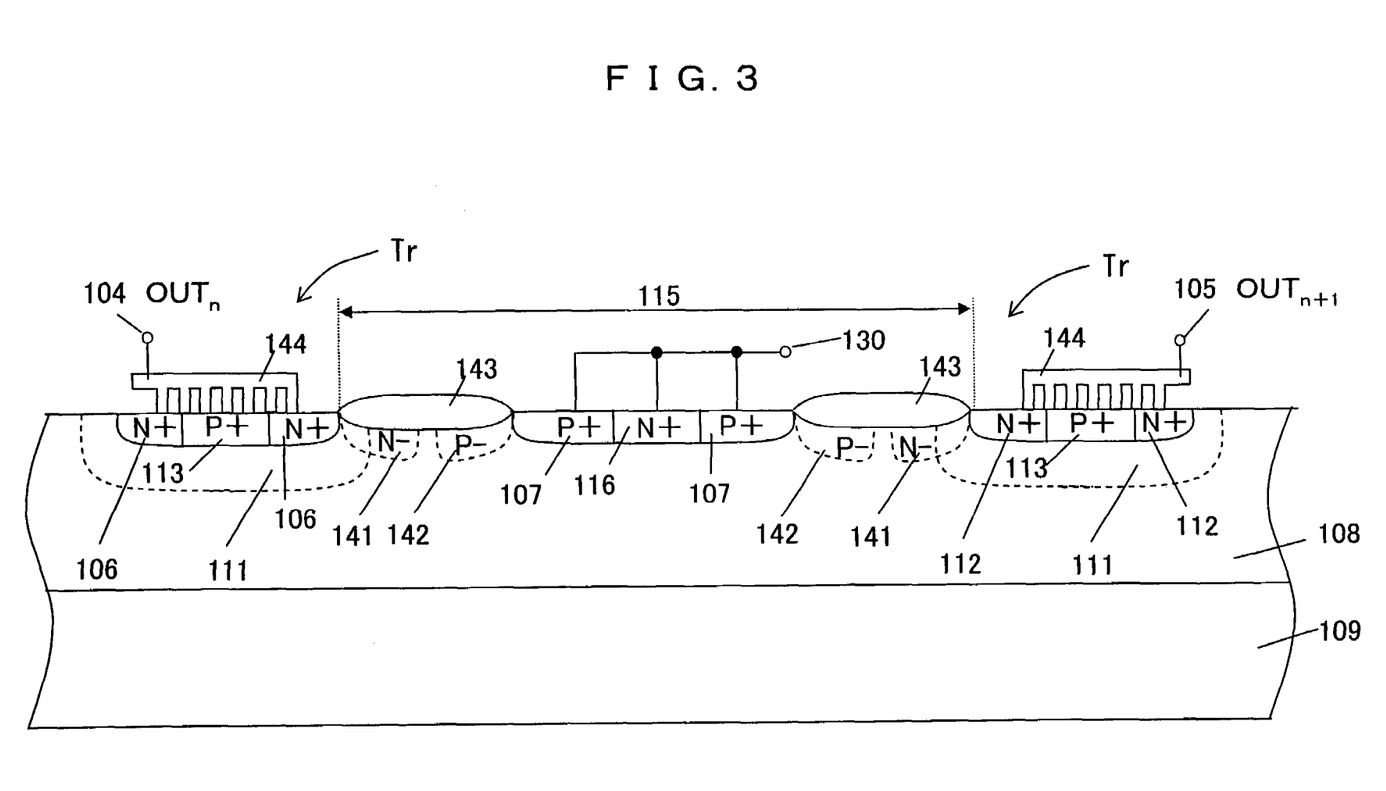
FIG. 3 shows a detailed sectional view according to the preferred embodiment 1.
Figure 4:
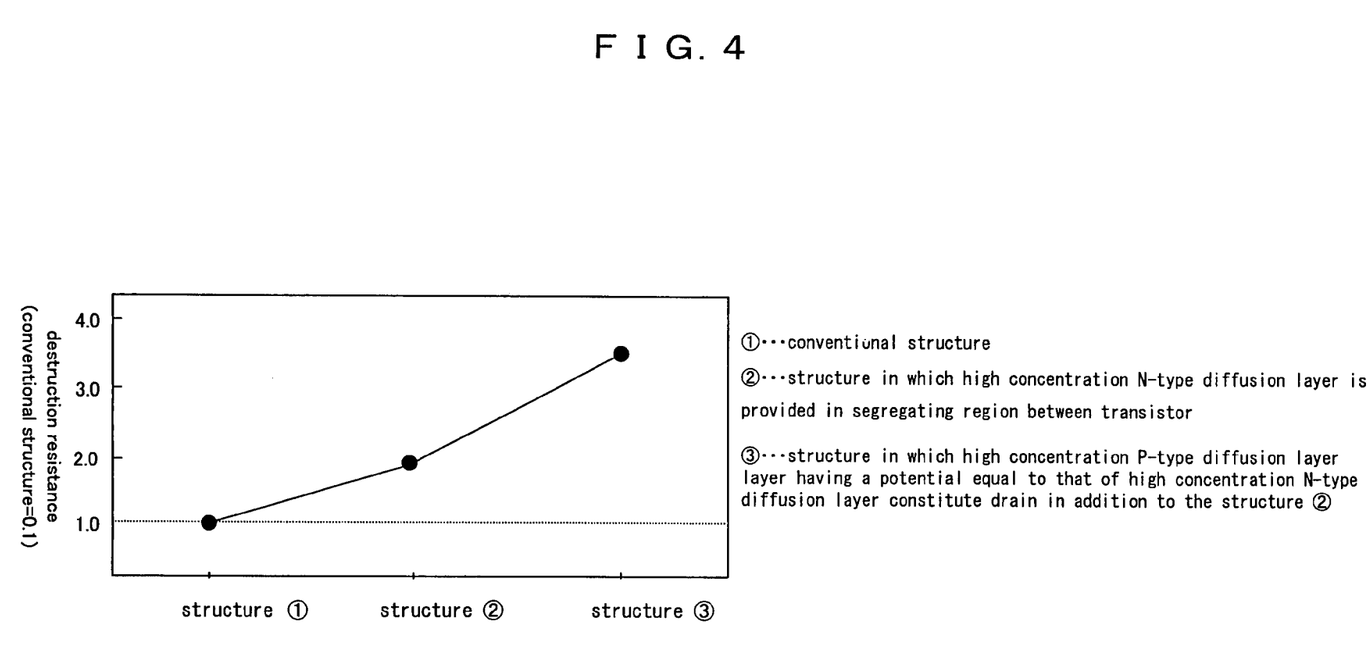
FIG. 4 shows an evaluation result of a destruction resistance according to the preferred embodiment 1.

Hereinafter, the working examples of the present invention are described in detail referring to FIGS. 3 and 4. FIG. 3 is a sectional view illustrating a development example in the preferred embodiment 1. FIG. 4 is an illustration of an evaluation result of the destruction resistance in the development example in which the preferred embodiment 1.

In FIG. 3, 141 denotes an N-type offset diffusion layer, 142 denotes a P-type offset diffusion layer, 143 denotes LOCOS, and 144 denotes an aluminum electrode for retrieving outputs. A device is described below wherein a concentration of the P-type well 108 is $5.0 \times 10^{15}$ Atoms/cm$^{-3}$, a concentration of the low-potential N-type well 111 is $5.8 \times 10^{16}$ Atoms/cm$^{-3}$, concentrations of the N-type diffusion layers 106 and 116 are $5.0 \times 10^{20}$ Atoms/cm$^{-33}$, a concentration of the P-type diffusion layer 107 is $5.0 \times 10^{20}$ Atoms/cm$^{-3}$, a concentration of the N-type offset diffusion layer 141 is $3.0 \times 10^{16}$ Atoms/cm$^{-3}$, and a concentration of the P-type offset diffusion layer 142 is $5.0 \times 10^{16}$ Atoms/cm$^{-3}$, and the segregating region 115 which is a region between the opposing drains is designed to have the distance of 67 μm.

A 80V potential is supplied to the output terminal $OUT_n$ 104, a 0V potential is supplied to the adjacent output terminal $OUT_{n+1}$ 105, and a noise pulse of a negative potential is inputted to the output terminal $OUT_{n+1}$ 105. When the relevant noise level is increased, it exceeds the permissible current of the parasitic bipolar transistor 102, and the vicinity of the N-type diffusion layer 106 is consequently thermally destroyed.

In FIG. 4, a result of the resistance against the thermal destruction in the constitution according to the present invention wherein the N-type diffusion layer 116 is provided in the segregating region and the P-type diffusion layer 113 is provided in the drain region is compared to that of the resistance in the conventional constitution. It is known from the comparison that the resistance against the thermal destruction is improved during the operation of the NPN parasitic bipolar transistor 102 in the present invention in comparison to the conventional constitution.

Further, in the present invention, the segregating region 115 is reduced so that the noise resistance of the transistor can be improved without any increase to the chip size in comparison to the conventional structure in which the segregating region 115 is made wider in order to improve the destruction resistance.

PREFERRED EMBODIMENT 2

Figure 5:
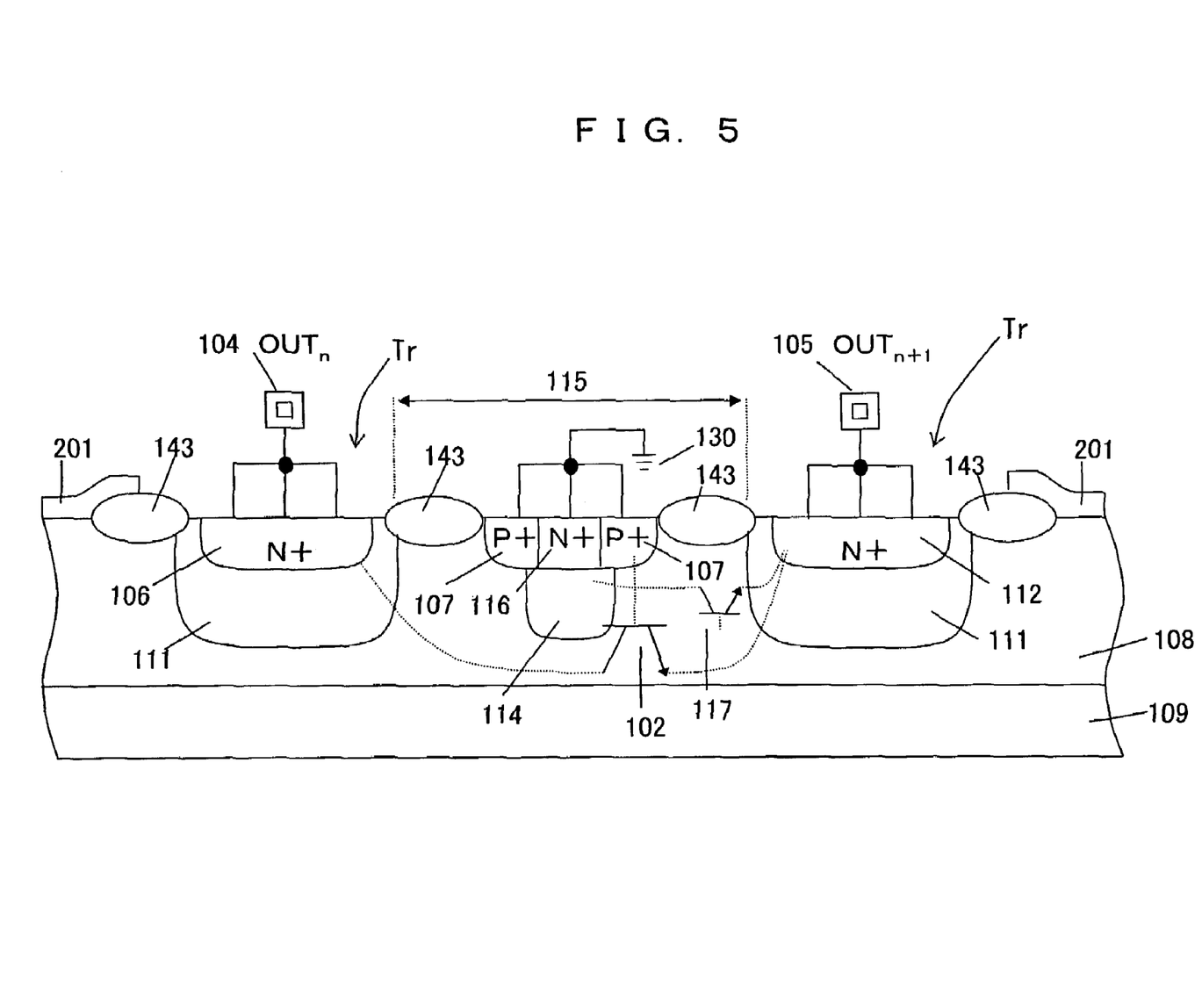
FIG. 5 is a schematic view of a sectional structure of a drive circuit for driving a PDP according to a preferred embodiment 2 of the present invention.
Figure 6:
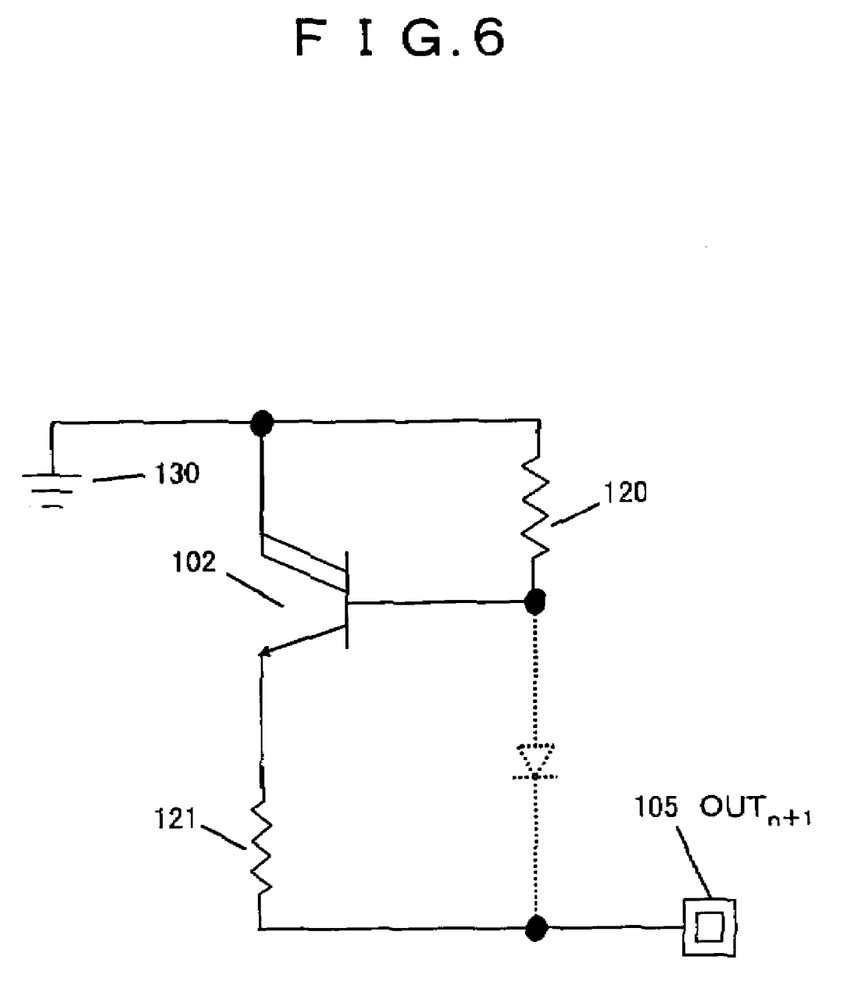
FIG. 6 shows an equivalent circuit between an output terminal $OUT_{n+1}$ and a ground terminal of the drive circuit according to the preferred embodiment 2.

A drive circuit according to a preferred embodiment 2 of the present invention is described referring to FIGS. 5 and 6. FIG. 5 is a schematic view of a sectional structure of a drive circuit for driving a PDP according to the preferred embodiment 2. FIG. 6 shows an equivalent circuit of the drive circuit for driving the PDP according to the preferred embodiment 2.

Next, a structure and an operation of the semiconductor circuit device are described. As described earlier, the NPN parasitic bipolar transistor 102 formed between the adjacent terminals is operated due to the self-noise or the external noise, and thereby the flow of the abnormal current is generated so as to cause the malfunction or the destruction.

In FIG. 5, 109 denotes a P-type substrate, 108 denotes a P-type well provided on the P-type substrate 109, Tr denotes a transistor provided on the P-type well 108, 115 denotes a segregating region provided between the adjacent transistors Tr and Tr, 114 denotes an N-type well provided in the segregating region 115, 107 denotes a high concentration P-type diffusion layer provided in the segregating region 115, and 116 denotes a high concentration N-type diffusion layer for reducing the collector current provided in the P-type diffusion layer 107 of the segregating region 115. The N-type diffusion layer 116 is provided on an upper side of the N-type well 114. 130 denotes a ground terminal (fixed potential supply terminal) connected to the P-type diffusion layer 107 and the N-type diffusion layer 116. A potential of the N-type diffusion layer 116 is fixed to a ground potential (GND) by the ground terminal 130. 111 denotes an N-type well for forming a high withstand voltage drain region of each of the transistors Tr. 106 and 112 denote a high concentration N-type diffusion layer provided on the N-type well 111. 104 denotes an output terminal $OUT_n$ of the transistor Tr. The output terminal $OUT_n$ 104 is connected to N-type diffusion layer 106. 105 denotes an output terminal $OUT_{n+1}$ of the transistor Tr adjacent to the transistor Tr. The output terminal $OUT_{n+1}$ 105 is connected to the N-type diffusion layer 112. 143 denotes LOCOS. 201 denotes a gate formation region.

In the present preferred embodiment, the N-type diffusion layer 116 for reducing the collector current is formed on the upper side of the N-type well 114. Accordingly, a collector area of the NPN parasitic bipolar transistor 117 in which the N-type diffusion layer 116 serves as the collector is increased, and the collector current flowing between the output terminal $OUT_n$ 104→high concentration N-type diffusion layer 106→N-type well 111→P-type well 108 is reduced.

As described above, according to the preferred embodiment 2, the high concentration N-type diffusion layer 116 is provided on the N-type well 111 of the segregating region 115 between the transistors constituting the drive circuit. Thereby, the collector current flowing between the N-type diffusion layer 106→N-type well 111→P-type well 108, which are formed between the adjacent transistors Tr, can be controlled. As a result, the resistance property against the malfunction or the destruction is improved. Thus, according to the preferred embodiment 2, the resistance against the noises between the adjacent terminals can be improved without any change to the conventional CMOS process.

Though this invention has been described in detail according to the most preferred embodiments, it will be understood that various modifications may be made therein, and it is intended to cover all such modifications in the appended claims as fall within the true spirit and scope of this invention.

What is claimed is:

1. A semiconductor circuit device comprising:

a P-type well;

a plurality of N-type wells provided on the P-type well;

a plurality of transistors having drains provided on the corresponding N-type wells;

a first high concentration N-type diffusion layer provided on the P-type well in a transistor segregating region of said plurality of transistors;

a first high concentration P-type diffusion layer provided on the P-type well in said transistor segregating region of said plurality of transistors;

a fixed potential supply terminal provided in said transistor segregating region of said plurality of transistors for supplying an equal potential by short-circuiting said first high concentration N-type diffusion layer and said first high concentration P-type diffusion layer;

a second high concentration N-type diffusion layer provided on said N-type well; and a second high concentration P-type diffusion layer provided on said N-type well, having a potential equal to said second high concentration N-type diffusion layer by short-circuiting said second high concentration P-type diffusion layer and said second high concentration N-type diffusion layer, and provided on drains of said transistors, wherein:

a parasitic PNP bipolar transistor is provided by said second high concentration P-type diffusion layer, said N-type well, said P-type well, and said first high concentration P-type diffusion layer in said transistor segregation region; and a parasitic NPN bipolar transistor is provided by said second high concentration N-type diffusion layer, said N-type well, said P-type well, and said first high concentration N-type diffusion layer in said transistor segregation region, so that said parasitic PNP bipolar transistor and said parasitic NPN bipolar transistor form a thyristor structure.

2. A display data line driver comprising the semiconductor circuit device according to claim 1 and connected to a display data electrode line of a display panel.

3. A semiconductor circuit device according to claim 1, wherein said plurality of transistors is provided by CMOS process.

* * * * *